United States Patent
Kuo et al.

(10) Patent No.: US 9,536,865 B1
(45) Date of Patent: Jan. 3, 2017

(54) INTERCONNECTION JOINTS HAVING VARIABLE VOLUMES IN PACKAGE STRUCTURES AND METHODS OF FORMATION THEREOF

(71) Applicant: Taiwan Semiconductor Manufacturing Company, Ltd., Hsin-Chu (TW)

(72) Inventors: Hsuan-Ting Kuo, Taichung (TW); Chung-Shi Liu, Hsin-Chu (TW); Hsiu-Jen Lin, Zhubei (TW); Hsien-Wei Chen, Hsin-Chu (TW); Ming-Da Cheng, Jhubei (TW); Wei-Yu Chen, Taipei (TW); Chih-Chiang Tsao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/807,225

(22) Filed: Jul. 23, 2015

(51) Int. Cl.
*H01L 21/822* (2006.01)
*H01L 25/065* (2006.01)
(Continued)

(52) U.S. Cl.
CPC ....... *H01L 25/0657* (2013.01); *H01L 21/4867* (2013.01); *H01L 21/563* (2013.01); *H01L 22/12* (2013.01); *H01L 23/49838* (2013.01); *H01L 24/17* (2013.01); *H01L 24/81* (2013.01); *H01L 25/50* (2013.01); *H01L 2224/02379* (2013.01); *H01L 2224/16148* (2013.01); *H01L 2224/16225* (2013.01); *H01L 2224/1703* (2013.01); *H01L 2224/8112* (2013.01); *H01L 2224/81191* (2013.01); *H01L 2224/81815* (2013.01); *H01L 2224/81908* (2013.01); *H01L 2225/06513* (2013.01); *H01L 2225/06555* (2013.01)

(58) Field of Classification Search
CPC .. H01L 21/822; H01L 23/562; H01L 23/3142; H01L 23/49816
See application file for complete search history.

(56) References Cited

U.S. PATENT DOCUMENTS 7,564,115 B2   7/2009   Chen et al.
7,633,165 B2   12/2009  Hsu et al.
(Continued)

OTHER PUBLICATIONS

JEDEC Solid State Technology Association, "Package Warpage Measurement of Surface-Mount Integrated Circuits at Elevated Temperature," JESD22-B112A (Revision of JESD22-B112, May 2005), Oct. 2009, 30 pages.

*Primary Examiner* — Phuc Dang
(74) *Attorney, Agent, or Firm* — Slater Matsil, LLP

(57) ABSTRACT

An embodiment method includes analyzing warpage characteristics of a first package component and a second package component and forming a plurality of solder paste elements on the first package component. A volume of each of the plurality of solder paste elements is based on the warpage characteristics of the first package component and the second package component. The method further includes aligning a plurality of connectors disposed on the second package component to the plurality of solder paste elements on the first package component and bonding the second package component to the first package component by reflowing the plurality of connectors and the plurality of solder paste elements.

20 Claims, 6 Drawing Sheets

(51) Int. Cl.
    *H01L 21/66*     (2006.01)
    *H01L 21/48*     (2006.01)
    *H01L 23/00*     (2006.01)
    *H01L 21/56*     (2006.01)
    *H01L 25/00*     (2006.01)
    *H01L 23/498*    (2006.01)

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2007/0015310 A1* | 1/2007 | Thompson et al. .. H05K 3/1225 438/106 |
| 2007/0269973 A1* | 11/2007 | Nalla et al. ............ H01L 24/11 438/612 |
| 2012/0146241 A1* | 6/2012 | Huang et al. ......... H01L 25/105 257/777 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2014/0374921 A1* | 12/2014 | Yu et al. ................ H01L 24/81 257/777 |

\* cited by examiner

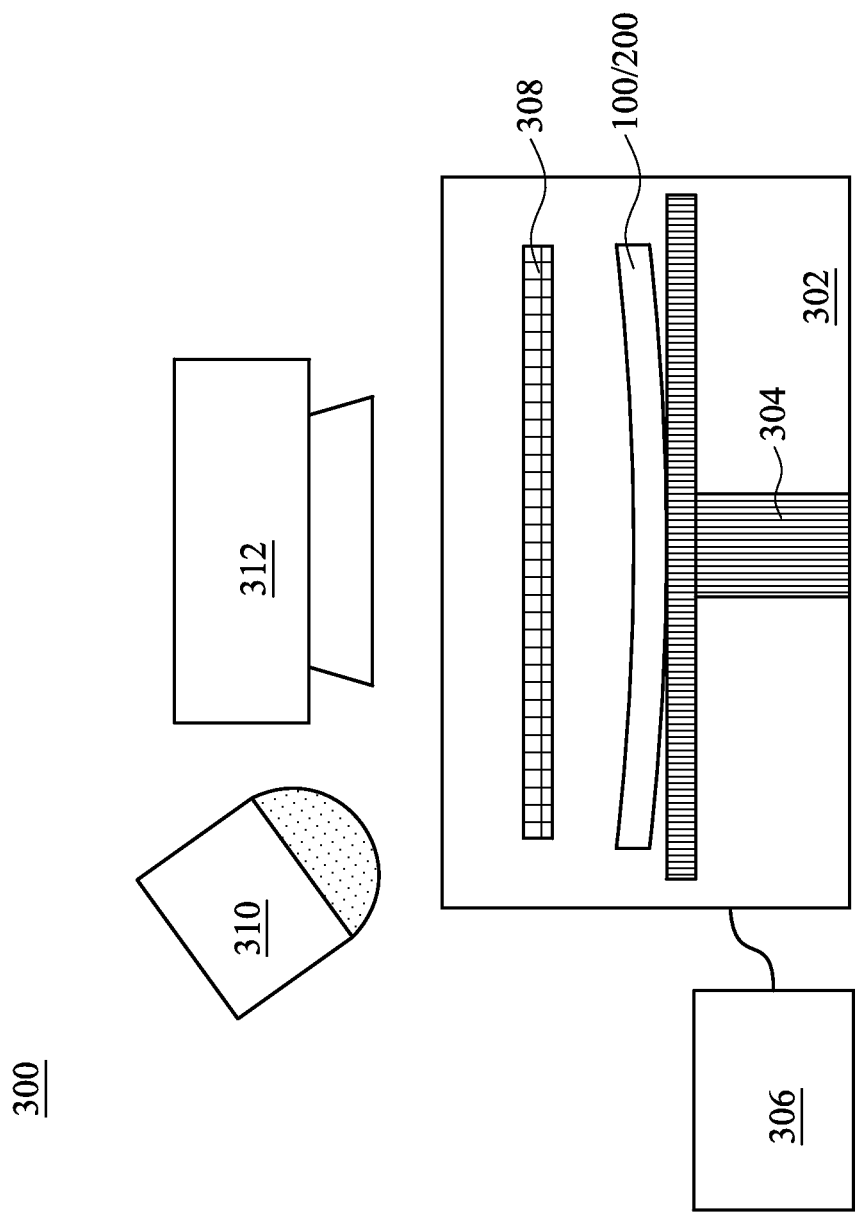

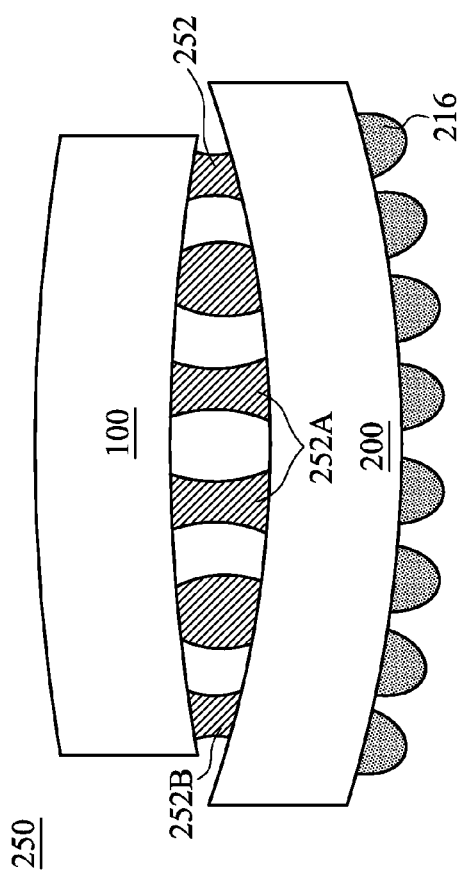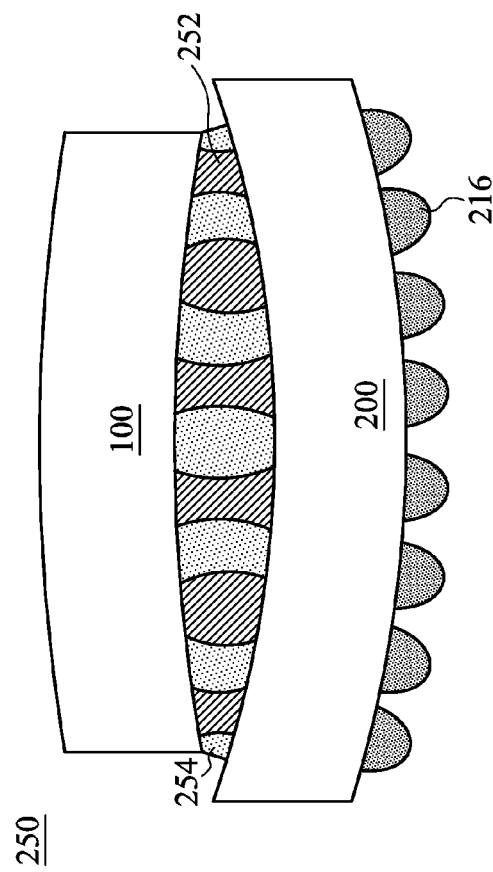

INTERCONNECTION JOINTS HAVING VARIABLE VOLUMES IN PACKAGE STRUCTURES AND METHODS OF FORMATION THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor components may be installed on top of one another to further reduce the form factor of the semiconductor device.

Two semiconductor components may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a system for analyzing the warpage characteristics of package components in accordance with some embodiments.

FIGS. 5 and 6 illustrate varying views of bonding two package components in accordance with some embodiments.

DETAILED DESCRIPTION

Figure 1:
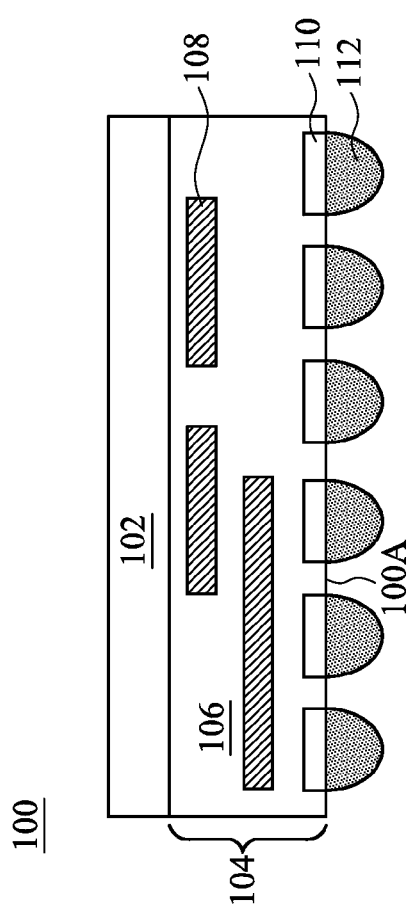
FIG. 1 illustrates a cross-sectional view of a first package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described with respect to a particular context, namely, bonding a semiconductor device die to an integrated fan-out wafer having fan-out redistribution layers. However, embodiments may be applied to bonding any two packaging components together. For example, various embodiments can be used to bond a device die, a device wafer, a fan-out package, a package substrate, an interposer, printed circuit boards, a mother board, and the like to another device die, device wafer, fan-out package, package substrate, interposer, printed circuit boards, mother board, and the like.

Various embodiments include two semiconductor components bonded together using connectors having variable sizes. An embodiment package includes a first package component (e.g., a device die) bonded to a second package component (e.g., a integrated fan-out wafer). During bonding, heat is typically applied during a reflow process, which may result in warpage of the package components. Thus, distances between the two package components may vary in different areas of the package. In an embodiment, individual connectors bonding the package components are configured to have varying sizes. For example, larger connectors are used in areas where the two package components are disposed further apart while smaller connectors are used in areas where the two package components are disposed closer together. By configuring varying sizes of connectors, interconnection defects (e.g., cold-joints and/or bridging) in the package are advantageously reduced.

Referring first to FIG. 1, a cross-sectional view of an embodiment package component (die 100) is provided. Die 100 may be a semiconductor die and could be any type of integrated circuit, such as a processor, logic circuitry, memory (e.g., a dynamic random access memory (DRAM) die), analog circuit, digital circuit, mixed signal, and the like. Die 100 may include a substrate 102, active devices (not illustrated) formed at a surface of substrate 102, and an interconnect structure 104. Substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at a surface of the substrate 102 (e.g., at an interface between substrate 102 and interconnect structure 104). Interconnect structure 104 may be formed over the active devices and substrate 102. Interconnect structure 104 may include dielectric layers 106 (e.g., inter-layer dielectric (ILD) and/or inter-metal dielectric (IMD) layers) containing conductive features 108 (e.g., conductive lines and vias comprising copper, aluminum, tungsten, combinations thereof, and the like) formed using any suitable method. Dielectric layers 106 may include low-k dielectric materials having k values, for example, lower than about 4.0 or even 2.0 disposed between conductive features 108. In some embodiments, dielectric layers 106 may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connects various active devices to form functional circuits within die 200. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

I/O and passivation features may be formed over the interconnect structure. For example, contact pads 110 may be formed over interconnect structure 104 and may be electrically connected to the active devices through the various conductive features in interconnect structure 104. Contact pads 110 may comprise a conductive material such as aluminum, copper, and the like. Furthermore, a passivation layer (not illustrated) may be formed over interconnect structure 104 and contact pads 110. In some embodiments, the passivation layer may be formed of non-organic materials such as silicon oxide, un-doped silicate glass, silicon oxynitride, and the like. Other suitable passivation materials may also be used. Portions of the passivation layer may cover edge portions of contact pads 110. Additional interconnect features (not illustrated), such as additional passivation layers, conductive pillars, and/or under bump metallurgy (UBM) layers, may also be optionally formed over contact pads 110. Furthermore, connectors 112 are formed over and electrically connect to contact pads 110. In subsequent process steps, connectors 112 may be used to bond die 100 to another package component (e.g., fan-out package 200, see FIG. 2). In an embodiment, connectors 112 are solder balls, such as ball grid array (BGA) balls, microbumps (μbumps), controlled collapse chip connection (C4) bumps, and the like. Connectors 112 may comprise a Sn—Ag alloy, a Sn—Cu alloy, a Sn—Ag—Cu alloy, or the like, and may be lead-free solder caps or lead containing solder caps. In an embodiment, connectors 112 may be about 30 μm to about 300 μm in diameter depending on die configuration. Other dimensions of connectors 112 may also be used in other embodiments. The various features of die 100 may be formed by any suitable method and are not described in further detail herein. Furthermore, the general features and configuration of die 100 described above are but one example embodiment, and die 100 may include any combination of any number of the above features as well as other features.

Figure 2:
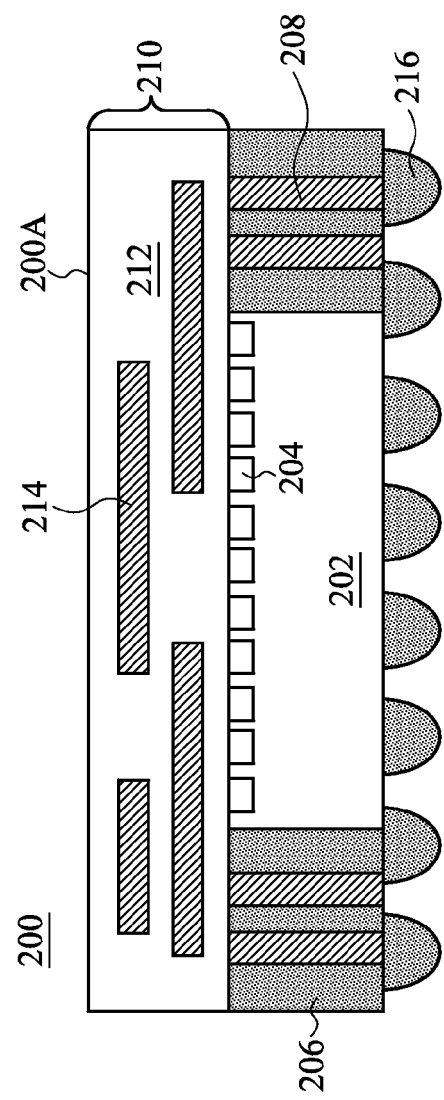
FIG. 2 illustrates a cross-sectional view of a second package component in accordance with some embodiments.

In FIG. 2, a cross-sectional view of a fan-out package 200 is provided. Package 200 includes a die 202, which may include similar features as die 100. Die 202 may include functional circuits, which may perform a same or different function as die 100. In an embodiment, die 202 is a logic die while die 100 is DRAM die. Die 202 includes contact pads 204, which may be electrically connected to active devices (not illustrated) within die 202.

A molding compound 206 is disposed around die 202. For example, in a top down view of molding compound 206/die 202 (not illustrated), molding compound 206 may encircle die 202. Molding compound 206 may provide suitable surfaces for forming fan-out RDLs, such as RDLs 210. Molding compound 206 may include any suitable material such as an epoxy resin, a molding underfill, and the like. Suitable methods for forming molding compound 206 may include compressive molding, transfer molding, liquid encapsulant molding, and the like.

One or more RDLs 210 may be formed over die 202 and molding compound 206. RDLs 210 may extend laterally past edges of die 202 to provide fan-out interconnect structures. RDLs 210 may include one or more polymer layers 212 formed over top surfaces of die 202 and molding compound 206. In some embodiments, polymer layers 212 may comprise polyimide (PI), PBO, benzocyclobuten (BCB), epoxy, silicone, acrylates, nano-filled pheno resin, siloxane, a fluorinated polymer, polynorbornene, and the like formed using any suitable means such as spin-on techniques, and the like. Conductive features 214 (e.g., conductive lines and/or vias) are formed within polymer layers 212. In subsequent process steps, die 100 may be bonded to an exposed surface of RDLs 210.

Additional package features, such as and external connectors 132 and through inter-vias (TIVs) 208 are formed in package 200. Connectors 216 may be solder balls, such as, ball grid array (BGA) balls, controlled collapse chip connector (C4) bumps, microbumps, and the like. Connectors 216 may be electrically connected to RDLs 210 by way of TIVs 208, which extend through molding compound 206. In an embodiment, TIVs 208 are conductive posts comprising copper, for example. In another embodiment, TIVs 208 may be omitted and connectors 216 may be electrically connected to RDLs 210 through internal conductive features (e.g., through-substrate vias (TSVs)) of die 202. Connectors 216 may be used to electrically connect die to other package components such as another device die, interposers, package substrates, printed circuit boards, a mother board, and the like.

In an embodiment, package components (e.g., die 100 and fan-out package 200) are designed and fabricated. The warpage characteristics of each package component are then analyzed prior to bonding. In an embodiment, Moiré measurements are taken in order to analyze and predict the warpage of package components during bonding. FIG. 3 illustrates an example apparatus 300, which may be used to make Moiré measurements of various package components. A sample of a package component (e.g., a sample of die 100 and/or package 200) is placed on a support platform 304 within a chamber 302. Chamber 302 may be a thermal enclosure, and a heat source 306 may be applied to heat the sample package component within chamber 302. In an embodiment, the sample package component may be heated to a similar temperature as applied during bonding processes. For example, the sample package component may be heated from room temperature (e.g., around 25° Celsius) to a temperature of or greater than a melting point of connectors on die 100 (e.g., about 350° Celsius or greater). Moiré measurements can be made either prior to or after connectors 112 are attached to die 100.

The application of heat may cause warpage in the sample package component. During or after heating a grating 308 (e.g., a mesh grid) is disposed over the sample package component. A light source 310 projects a beam of light at a predetermined angle onto the grating in order to cast a shadow grid pattern on the sample package component. As a result of the warpage, the shadow grid pattern may be distorted and different than a pattern of overlying grating 308. In another embodiment, a grid pattern may be projected onto the sample package component in lieu of using light source 310 and grating 308. A camera 312 is used to capture geometric patterns created by differences between grating 308 and the shadow grid pattern, which are referred to as Moiré fringe patterns. By analyzing these Moiré fringe patterns (e.g., using a computer processor), a three-dimensional topographical plot of the warped sample package component can be generated. In an embodiment, a sample of both die 100 and package 200 are analyzed, and three-dimensional topographical plots of warpage for both die 100 and package 200 are generated. Other methods and/or systems for analyzing warpage may also be used.

In various embodiments, the surface of die 100 and package 200 is a surface used for bonding (e.g., surface 100A in FIG. 1 and surface 200A in FIG. 2). By analyzing the warpage of the package components (die 100 and package 200), distances between die 100 and package 200 in different areas of the bonding surfaces can be estimated. As discussed above, the distance between die 100 and package 200 may vary due to warpage. Thus, a volume connectors (e.g., connectors 252 in FIG. 6) used to bond die 100 and package 200 may be configured in accordance with this estimated distance. In an embodiment, the analyzed warpage characteristics of various package components are used to determine a desired volume of various connectors used to bond the package components. For example, larger connectors may be formed in areas where die 100 and package 200 are disposed farther apart while smaller connectors may be formed in areas where die 100 and package 200 are disposed closer together.

Figure 4A:
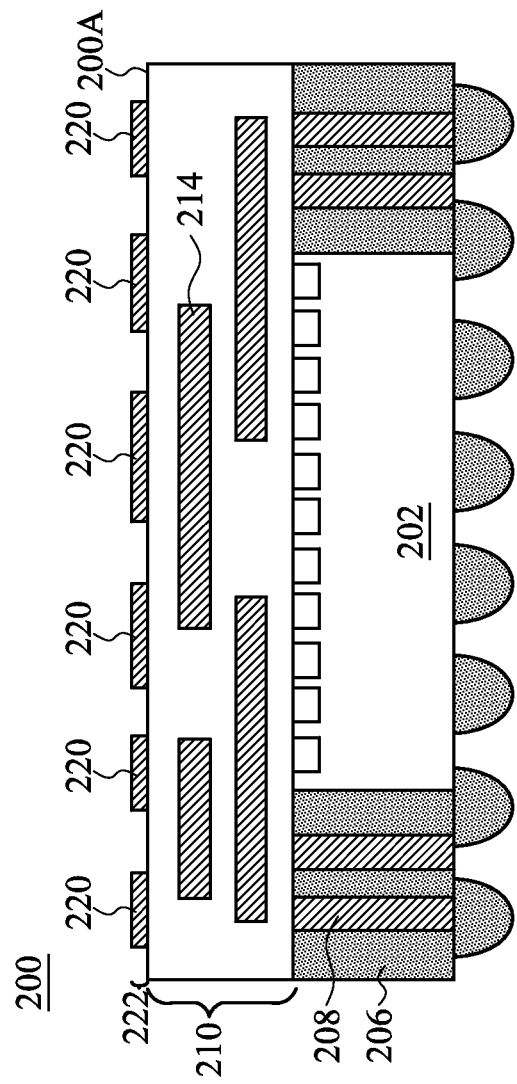
FIGS. 4A, 4B, and 4C illustrate varying views of forming a solder paste layer over a package component and a solder paste stencil for forming the solder paste layer in accordance with some embodiments.

FIG. 4A illustrates the formation of a layer 222 of solder paste on surface 200A of package 200. Layer 222 includes a plurality of solder paste elements 220, which are non-uniform in size. For example, the size of each solder paste element 220 may vary depending on an estimated distance between surface 200A of package 200 and surface 100A of die 100 (see FIG. 1) after bonding. For example, a volume of a solder paste element 220 may be greater in areas where the estimated distance between the surfaces is greater while a volume of a solder paste element 220 may be less in areas where the estimated distance between surfaces 100A/200A is smaller. In subsequent process steps, connectors of die 100 (e.g., connectors 112) are aligned, reflowed, and bonded to solder paste elements 220. Thus, by varying the size of each solder paste element 220, connectors of varying sizes may be formed between package 200 and die 100.

Figure 4B:
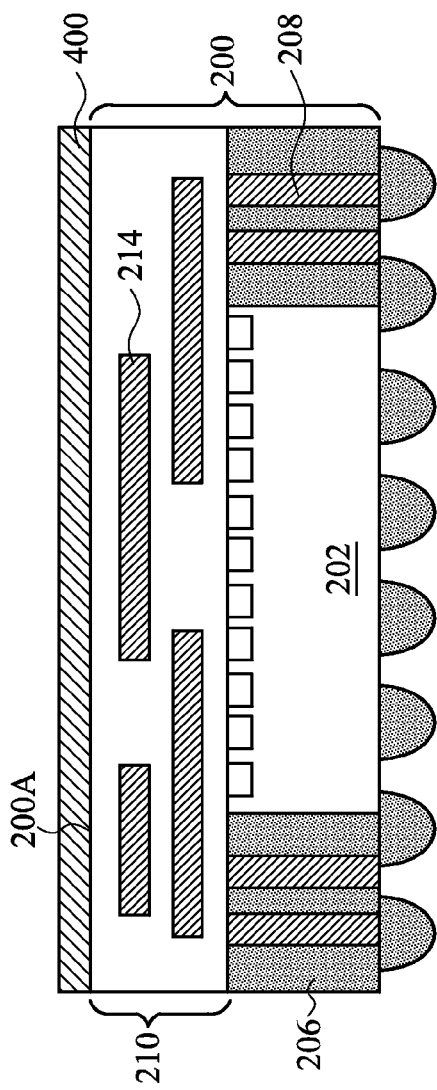
Figure 4C:
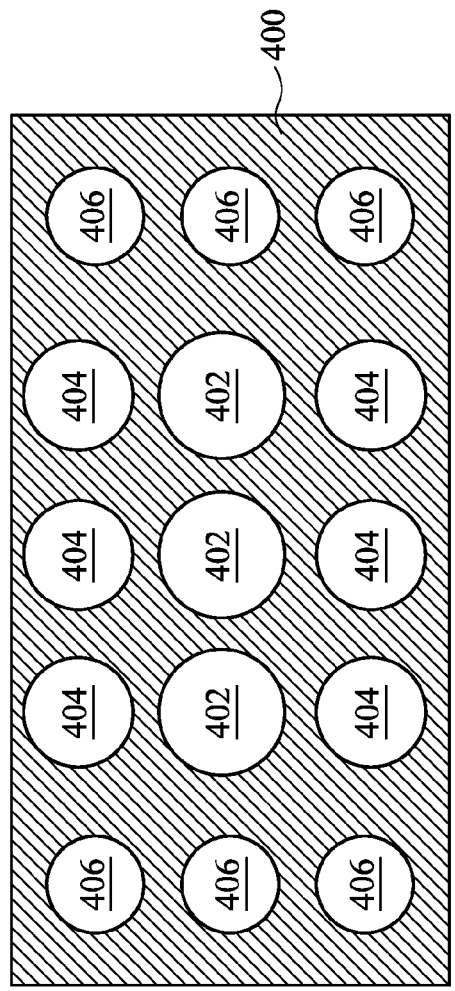

In an embodiment, the application of layer 222 is performed through stencil printing, which includes placing a stencil 400 (see FIG. 4B) over package 200. Through-holes 402, 404, and 406 of stencil 400 (see a top-down view of stencil 400 in FIG. 4C) are aligned to contact regions of surface 200A (e.g., regions electrically connected to conductive features 214 and die 202). As illustrated by FIG. 4C, stencil 400 includes through-holes of varying sizes, such as small through-holes 402, medium through-holes 404, and large through-holes 406. Through-holes 402, 404 and 406 may be formed by laser-drilling a bulk substrate, for example. In an embodiment, stencil 400 comprises a metal, a polymer, or any other suitable material. Dimensions of each through-hole 402, 404, and 406 may vary between about 30 μm to about 300 μm, for example. Through-holes having other dimensions may also be included depending on device configuration. Although stencil 400 is illustrated as having three differently sized through-holes in a particular configuration, other embodiment stencils may have through-holes of any number of sizes in any configuration. Furthermore, although the illustrated through-holes are circular in shape, through-holes in other stencils may have any shape, such as, ovular, rectangular, and the like.

The specific configuration of stencil 400 is based on the warpage characteristics of the package components to be bonded (e.g., die 100 and package 200). For example, stencil 400 is configured based on the Moiré analysis of die 100/package 200 as described above. Stencil 400 may be used to bond multiple iterations of dies 100 to multiple iterations of packages 200 having a same configuration. However, for package components having different configurations, additional stencils having different configurations are used. In an embodiment, a package manufacturer may analyze the warpage characteristics of various package components, design a package component-specific stencil based on the analysis, and provide the design to a stencil manufacturer. The stencil manufacturer may then form one or more stencils based on the provided design. Each stencil is then used to form solder paste on one or more package components having a configuration the stencil was designed for.

After stencil 400 is placed on package 200, solder paste is then applied on stencil 400. Excess solder paste is then wiped out using squeegee (not illustrated). The squeegee has a planar bottom surface, and hence the portion of solder paste left in through-holes 402, 404, and 406 has a planar top surface. After stencil 400 is lifted, solder paste elements 220 are left on surface 200A of package 200. Thus, solder paste elements 220 may be formed having non-uniform sizes based on the configuration of stencil 400.

Solder paste elements 220 may include metal particles mixed with an adhesive. The metal particles may include the particles of a pure metal, a metal alloy, or the like. In some embodiments, solder paste elements 220 comprise lead-free solder, such as tin, silver, copper (SAC) solder, tin bismuth (SnBi) solder, and the like. Solder paste elements 220 are applied as a semi-fluid, so that it can be stencil-printed, yet can maintain its shape before cured. After stencil printing, a curing process may be performed.

After solder paste elements 220 are formed, die 100 is placed on package 200 using a suitable tool, such as a pick-and-place tool. Connectors 112 (see FIG. 1) of die 100 may be aligned to each solder paste element 220 of package 200. After stacking, a reflow process is performed to melt connectors 112 and solder paste elements 220 together, bonding die 100 to package 200. In an embodiment, the reflow process is performed by heating die 100/package 200 to a suitable temperature for melting connectors 112. For example when connectors 112 comprise solder, die 100/package 200 is heated to a temperature of about 180° C. to about 260° C. The resulting structure 250 is provided in FIG. 5, which illustrates die 100 bonded to package 200 by connectors 252. Connectors 252 are formed by reflowing connectors 112 with solder paste elements 220. Because solder paste elements 220 are formed to have varying sizes, connectors 252 are also non-uniform in size. For example, in the illustrated embodiment, connectors 252 include larger connectors 252A and smaller connectors 252B. In an embodiment, a standoff height (e.g., a difference between a highest and lowest point) of a larger connector 252A may be about 100% to about 150% of a standoff height of a smaller connector 252B. It has been observed that by configuring connectors of different sizes in the above ratio, reductions in manufacturing defects due to bonding can be achieved. Connectors 252 may also vary in shape. For example, in the illustrated embodiments, a first subset of connectors 252 comprises convex sidewalls while a second subset of connectors 252 comprises concave sidewalls.

Furthermore, as a result of the reflow process, warpage of the bonded package components (die 100/package 200) may occur. For example, in FIG. 5, edge regions of die 100 are spaced closer to package 200 than center regions of die 100/package 200. The warpage characteristics of die 100/package 200 were previously estimated as described above. Thus, connectors 252 are formed to be larger in areas where die 100/package 200 are spaced farther apart. Connectors 252 are further formed to be smaller in areas where die 100/package 200 are spaced closer together. Manufacturing defects (e.g., bridging and/or cold-joints) may be reduced by configuring connectors 252 to have varying sizes based on analyzed warpage of the package components. Although FIG. 5 illustrates package 250 to have a particular shape as a result of warpage, package 250 may have any shape. For example, in another embodiment, the various package components may be spaced closer together in a center region and farther apart in edge regions.

Subsequently, an underfill 254 may be dispensed around connectors 252 between die 100 and package 200 as illustrated by FIG. 6. Underfill 254 may be included to provide structural support and protection to connectors 252. Thus, two package components, die 100 and package 200, may be bonded together using connectors 252 of varying sizes to reduce manufacturing defects of the bonding process.

Figure 7:
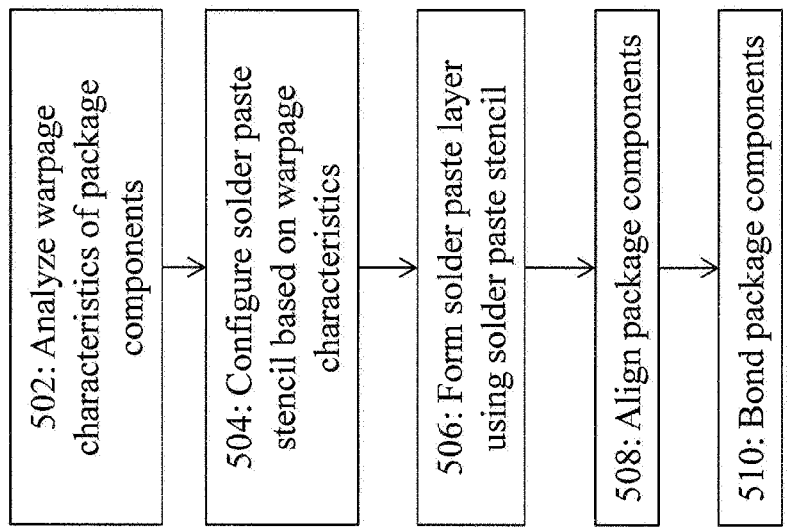
FIG. 7 illustrates a process flow for bonding two package components in accordance with some embodiments.

FIG. 7 illustrates a process flow 500 for forming a bonded package structure in accordance with some embodiments. In step 502, warpage characteristics of package components (e.g., die 100 and package 200) are analyzed. Analyzing the warpage characteristics may include estimating a distance between the two package components after bonding. In an embodiment, analyzing the warpage characteristics including generating topographical maps of the package components after taking Moiré measurements of sample package components having a same configuration as the package components. In step 504, a solder paste stencil (e.g., stencil 400) is configured based on the warpage characteristics of the package components. For example, sizes of each through-hole in the solder paste stencil may be selected based on the warpage characteristics. Thus, the stencil may be package-component specific. For example, when package components having different configurations are bonded, a different stencil configuration is used. The resulting stencil includes through-holes of varying sizes.

In step 506, a solder paste layer (e.g., layer 222) is formed on a surface of one of the package components using the solder paste stencil. Because the solder paste stencil comprises through-holes of varying sizes, the size of each individual solder paste element may also vary. In step 508, the package components are aligned. For example, solder balls (e.g., connectors 112) of one package component may be aligned to the solder paste elements. In step 510, the two package components are bonded by applying a reflow process. The reflow melts the solder paste elements and the solder balls to form connectors between the two package components. Due to the varying size of each solder paste element prior to reflow, the bonded connectors may also vary in size. For example, connectors may be larger in areas where the two package components are disposed farther apart, and connectors may be smaller in areas where the two package components are disposed closer together.

An embodiment package includes a first package component (e.g., a device die) bonded to a second package component (e.g., an integrated fan-out wafer). During bonding, heat is typically applied during a reflow process, which may result in warpage of the package components. Thus, distances between the two package components may vary in different areas of the package. In an embodiment, individual connectors bonding the package components are configured to have varying sizes. For example, larger connectors are used in areas where the two package components are disposed further apart while smaller connectors are used in areas where the two package components are disposed closer together. The connectors may be formed by analyzing the warpage characteristics of test package components (e.g., using Moiré analysis) and configuring a package component-specific stencil for the application of solder paste on one of the package components. By varying the size of solder paste, the subsequently formed connectors may also vary in size. Thus, interconnection defects (e.g., cold-joints and/or bridging) in the bonded package are advantageously reduced.

In accordance with an embodiment, a method includes analyzing warpage characteristics of a first package component and a second package component and forming a plurality of solder paste elements on the first package component. A volume of each of the plurality of solder paste elements is based on the warpage characteristics of the first package component and the second package component. The method further includes aligning a plurality of connectors disposed on the second package component to the plurality of solder paste elements on the first package component and bonding the second package component to the first package component by reflowing the plurality of connectors and the plurality of solder paste elements.

In accordance with another embodiment, a method includes analyzing a warpage characteristic of a first package component, configuring a solder paste stencil based on the warpage characteristic of the first package component, and forming a plurality of solder paste elements on a surface of the first package component by stencil printing using the solder paste stencil. Analyzing the warpage characteristic includes estimating distances between the first package component and a second package component when the first package component is bonded to the second package component. The plurality of solder paste elements is non-uniform in size.

In accordance with yet another embodiment, a package structure includes a first package component, a second package component, and a plurality of connectors bonding a first surface the first package component to a second surface of the second package component. The plurality of connectors is non-uniform in size, and a size of each of the plurality of connectors is selected in accordance with warpage characteristics of the first package component and the second package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
analyzing warpage characteristics of a first package component and a second package component;
forming a plurality of solder paste elements on the first package component, wherein a volume of each of the plurality of solder paste elements is based on the warpage characteristics of the first package component and the second package component, and wherein a first volume of a first one of the plurality of solder paste elements is different from a second volume of a second one of the plurality of solder paste elements;
aligning a plurality of connectors disposed on the second package component to the plurality of solder paste elements on the first package component; and
bonding the second package component to the first package component by reflowing the plurality of connectors and the plurality of solder paste elements.

2. The method of claim 1, wherein forming the plurality of solder paste elements comprises a stencil printing process using a stencil comprising a plurality of through-holes.

3. The method of claim 2, further comprising selecting a size for each of the plurality of through-holes based on the warpage characteristics of the first package component and the second package component.

4. The method of claim 1 wherein analyzing the warpage characteristics of the first package component and the second package component comprises estimating a distance between the first package component and the second package components at various areas after bonding the second package component to the first package component.

5. The method of claim 4, wherein forming the plurality of solder paste elements comprises:
forming a first solder paste element having a first volume at a first area of the first package component; and
forming a second solder paste element having a second volume at a second area of the first package component, wherein the first volume is greater than the second volume, and wherein an estimated distance between the first package component and the second package component is larger in the first area than in the second area.

6. The method of claim 1, wherein analyzing the warpage characteristics comprises taking Moiré measurements of sample package components having a same configuration as the first package component and the second package component.

7. The method of claim 1, wherein the first package component is a fan-out wafer, and wherein the second package component is a device die.

8. The method of claim 1 further comprising after reflowing the plurality of connectors and the plurality of solder paste elements, forming an underfill between the first package component and the second package component.

9. A method comprising:
analyzing a warpage characteristic of a first package component, wherein analyzing the warpage characteristic comprises estimating distances between the first package component and a second package component when the first package component is bonded to the second package component;
configuring a solder paste stencil based on the warpage characteristic of the first package component; and
forming a plurality of solder paste elements on a surface of the first package component by stencil printing using the solder paste stencil, wherein the plurality of solder paste elements is non-uniform in size.

10. The method of claim 9, further comprising:
aligning a plurality of solder balls on the second package component to the plurality of solder paste elements; and
reflowing the plurality of solder balls and the plurality of solder paste elements to form a plurality of connectors bonding the first package component to the second package component, wherein the plurality of connectors is non-uniform in size.

11. The method of claim 10, wherein the solder paste stencil comprises a plurality of through-holes, wherein the method further comprising wherein configuring the solder paste stencil comprises selecting a size for each of the plurality of through-holes based on the warpage characteristic of the first package component.

12. The method of claim 11, wherein selecting the size for each of the plurality of through-holes based on the warpage characteristic of the first package component comprises selecting a larger size for a first through-hole disposed in at a first location than for a second through-hole disposed at a second location, and wherein a distance between the first package component and the second package component is greater at the first location than at the second location.

13. The method of claim 9 further comprising using one or more solder paste stencils having a same configuration as the solder paste stencil to form solder paste elements on a plurality of first package components, wherein each of the plurality of first package components comprises a same configuration as the first package component.

14. The method of claim 13 further comprising bonding each of the plurality of first package components to a respective one of a plurality of second package components, wherein each of the plurality of second package components comprises a same configuration as the second package component.

15. The method of claim 9 further comprising forming a plurality of additional solder paste elements on a surface of a third package component using an additional solder paste stencil, wherein the third package component comprises a different configuration than the first package component, and wherein the additional solder paste stencil comprises a different configuration than the solder paste stencil.

16. The method of claim 9 wherein analyzing the warpage characteristics of the first package component comprises generating a topographical plot of a sample package component having a same configuration as the first package component.

17. A method comprising:
forming first solder paste elements on a surface of a first package component using a first stencil;

bonding a second package component to the first package component, wherein the first stencil has a first configuration in accordance with estimated warpage characteristics of the first package component and the second package component;

forming second solder paste elements on a surface of a third package component using a second stencil having a second configuration different from the first configuration; and bonding a fourth package component to the third package component, wherein the second configuration is in accordance with estimated warpage characteristics of the third package component and the fourth package component.

18. The method of claim 17, wherein the first solder paste elements are non-uniform in size.

19. The method of claim 17 further comprising estimating warpage characteristics of the first package component and the second package component by taking Moiré measurements of a first sample package component and a second sample package component, wherein the first sample package component has a same configuration as the first package component, and wherein the second sample package component has a same configuration as the second package component.

20. The method of claim 17, wherein bonding the second package component to the first package component comprises reflowing a plurality of connectors with the first solder paste elements, and wherein the plurality of connectors are disposed on the second package component and are substantially uniform in size.

* * * * *